(12) United States Patent
Angelakos et al.

(10) Patent No.: US 11,275,308 B2
(45) Date of Patent: Mar. 15, 2022

(54) PHOTOEXCITATION METHOD

(71) Applicant: Nanotronix Inc., Wilmington, DE (US)

(72) Inventors: Evangelos Angelakos, Wilmington, DE (US); Theodoros Manouras, Wilmington, DE (US)

(73) Assignee: Nanotronix Inc., Wilmington, DE (US)

( * ) Notice: Subject to any disclaimer, the term of this patent is extended or adjusted under 35 U.S.C. 154(b) by 33 days.

Patent file contains an affidavit/declaration under 37 CFR 1.130(b).

(21) Appl. No.: 16/081,777

(22) PCT Filed: Mar. 4, 2016

(86) PCT No.: PCT/GB2016/050575
§ 371 (c)(1),
(2) Date: Aug. 31, 2018

(87) PCT Pub. No.: WO2017/149264
PCT Pub. Date: Sep. 8, 2017

(65) Prior Publication Data
US 2019/0011836 A1  Jan. 10, 2019

(51) Int. Cl.
*G03F 7/20* (2006.01)
*G03F 7/004* (2006.01)
*G11B 7/0045* (2006.01)

(52) U.S. Cl.
CPC .......... *G03F 7/2006* (2013.01); *G03F 7/0045* (2013.01); *G03F 7/70025* (2013.01); *G03F 7/70375* (2013.01); *G03F 7/70383* (2013.01); *G11B 7/0045* (2013.01); *G11B 7/00451* (2013.01)

(58) Field of Classification Search
CPC .. G03F 7/2006; G03F 7/0045; G03F 7/70024; G03F 7/70375; G03F 7/70383; G11B 7/00451
See application file for complete search history.

(56) References Cited

U.S. PATENT DOCUMENTS 4,547,444 A * 10/1985 Bell .................. G11B 7/245
                                                    346/135.1
6,026,072 A *  2/2000 Taira ................ G11B 7/24085
                                                    369/275.3
(Continued)

FOREIGN PATENT DOCUMENTS

WO    2015092570    6/2015
WO    2017149264    9/2017

OTHER PUBLICATIONS

Manouras et al. "Multiphoton Laser Ablation Lithography (MP-LAL) using 375 nm continuous wave laser enabling patterning down to the 30 nm regime and beyond", presented Sep. 21-24, 2015 @ MNE2015 (Hague/Netherlands).*

(Continued)

*Primary Examiner* — Martin J Angebrandt
(74) *Attorney, Agent, or Firm* — Patshegen IP LLC; Moshe Pinchas

(57) ABSTRACT

A method and composition for enabling indirect photoexcitation whereby a large energy gap between energy levels in a second material is circumvented by a series of lower energy photoexcitations in a first material.

16 Claims, 12 Drawing Sheets

(56) References Cited

U.S. PATENT DOCUMENTS

| | | | | |
|---|---|---|---|---|
| 7,261,444 | B2* | 8/2007 | Bayer | F21V 5/06 362/405 |
| 2006/0204706 | A1* | 9/2006 | Horie | G11B 7/2467 428/64.4 |
| 2006/0246251 | A1* | 11/2006 | Suda | G11B 7/243 428/64.4 |
| 2008/0310293 | A1* | 12/2008 | Watanabe | G11B 7/256 369/275.4 |
| 2009/0028946 | A1* | 1/2009 | Sheardown | A61K 41/0028 424/487 |
| 2012/0322200 | A1* | 12/2012 | Afzali-Ardakani | H01L 31/1804 438/98 |
| 2013/0033975 | A1* | 2/2013 | Gindre | G11B 7/25 369/101 |

OTHER PUBLICATIONS

Opticon News page (downloaded May 2020).*

Fujiwara et al., "Laser ablation of a pyrene-doped poly(methyl methacrylates film: Dynamics of pyrene transient species by spectroscopic measurements" J. Phys. Chem., vol. 99(31) pp. 11844-11853 (1995).*

Avis et al., Effect of concentration on the absorption and fluorescence spectra of pyrene in a solid solution of poly(methyl methacrylate), J. Chem. Soc., Faraday Trans II, Mol.. Chem. Phys., vol. 70 pp. 1057-1065 (1974).*

Nakagawa et al., Excimer luminescence form non-resonantly excited pyrene and perylene molecules in solution. J Phys. Chem. A., vol. 117 pp. 11449-11455 (2013).*

Biver et al., "Influence of pyrene grafting on PMMA nanosecond laser ablation at 248 nm", Appl. Mater. & Interfac., vol. 6 pp. 41-48 (Dec. 2013).*

Sekine, Studies on conformational characteristics and self-assembled structures of polymers in space-limited systems, Thesis, Kyoto University (Jul. 2009).*

Lippert et al. "Laser ablation of doped polymer systems", Adv. Mater., vol. 9(2) pp. 105-119 (1997).*

Kappes et al. "A study of photothermal laser ablation of various polymers on microsecond time scales", Springer plus vol. 3 article 489 (15pages) (2014).*

Pearson, "Polymers in optical recording", in "Electronic and photonic applications of polymers"Advances in Chemistry vol. 218, pp. 331-353 (1988).*

Acikgoz et al.. "Investigation of spontaneous emission rate of perylene dye molecules encapsulated into three-dimensional nanofibers via FLIM method" Appl. Phys. A., vol. 116, pp. 1867-1875 (Mar. 2014).*

PicoQuant website for LDH series lasers (downloaded Oct. 15, 2020).*

Dartnell et al., "Experimental Determination of photostability and fluorescence-based detection of PAHs on the martial surface", Meter. Planet., Sci., vol. 47(5) pp. 806-819 (2012).*

Zhang et al. "Nanoprocessing of glass and PMMA by means of near-infrared sub-15 femtosecond laser pulses", Proc SPIE 7921 article 79210L (10 pages, Feb. 2011).*

Ding et al., "Near-field optical drilling of sub-lambda pits in thin polymer films", ACS photonics, vol. 4 pp. 1292-1297 (2017).*

Ding et al., "Near-field optical drilling of sub-lambda pits in thin polymer films", ACS photonics, vol. 4 pp. 1292-1297 (2017) supporting information (7 pages).*

PCT; International Preliminary Report on Patentability dated Sep. 4, 2018 in International Application No. PCT/GB2016/050575.

PCT; International Search Report dated Aug. 12, 2016 in International Application No. PCT/GB2016/050575.

PCT; Written Opinion dated Aug. 12, 2016 in International Application No. PCT/GB2016/050575.

Manouras et al., "Exploring the Potential of Multiphoton Laser Ablation Lithography (MP-LAL) as a Reliable Technique for Sub-50nm Patterning," Optical Sensing II SPI E, vol. 9777, pp. 97771C-97771C, (2016).

WWW.Spie Org., "Advanced Lithography @ Bullet," https://spie.org/Documents/ConferencesExhibitions/AL16-final-L.pdf, 76 Pages, (2016).

* cited by examiner

|  | Power mW | Irradiance MW/cm^2 | Energy uJ | Photon |
|---|---|---|---|---|
| CW REF | 100 | 18.0387 | 100000 | 1.89e+17 |
| CW EXF | 100 | 18.0387 | 100000 | 1.89e+17 |

|  | kW | TW/cm^2 | nJ |  |
|---|---|---|---|---|
| PULSE | 0.2538 | 35.9061 | 0.027016 | 5.10e+07 |

PHOTOEXCITATION METHOD

CROSS-REFERENCE TO RELATED APPLICATIONS

This application is a U.S. national phase filing under 35 U.S.C. § 371 of PCT/GB2016/050575 filed on Mar. 4, 2016 and entitled "PHOTOEXCITATION METHOD," the disclosure of which is incorporated herein by reference.

FIELD OF INVENTION

The invention relates to improvements in photoexcitation. Particularly, but not exclusively, it relates to methods of photolithography and composite photoresists.

BACKGROUND TO THE INVENTION

Manufacturing of nanometer scale structures has applications in a wide range of fields. Progress in the semiconductor industry is driven by reducing the minimum feature size attainable by lithography. Technological advancement is in the fields of photonics, meta-surfaces and MEMs/Sensors is similarly reliant on this Critical Dimension shrinkage.

In general, the minimum feature size of a lithographic process is limited by the wavelength of the light used. Ultraviolet (UV) photolithography is the most commonly employed patterning method, whilst the next generation of lithographic techniques (such as Extreme UV Lithography, Directed-Self-Assembling (DSA) and Nanoimprint Lithography (NIL)) are being investigated and developed. For applications requiring sub-100 nm resolution, electron-beam lithography is used almost exclusively.

The laser ablation of polymeric films was proposed as an alternative lithographic approach, allowing for direct writing applications. Despite extensive investigations, the best resolution in laser ablation processes has been limited to dimensions above 1 micron and only recently has submicron resolution been demonstrated, requiring the use of high energy, femtosecond lasers. Similarly, whilst investigations have been made regarding the applications of polymers, polyimides and dye doped systems, to laser ablation processes, the use of organic polymers as lithographic materials in laser ablation processes has been limited to low resolution applications.

In general, the resolution of laser ablation is limited by the spot size of the laser used, with spot size being proportional to the laser wavelength. Equally, the resist coating used in laser ablation lithography must typically absorb high energy, low wavelength photons in order to degrade and allow ablation of the exposed areas beneath.

The use of high energy, low wavelength lasers have a number of associated disadvantages including unwanted absorption in air (with such systems therefore requiring expensive and complicated vacuum environments), collateral damage to the sample, and ionisation and charging of certain materials. Equally, low wavelength lasers suffer from a low depth of focus which restricts the thickness of the photoresist and the depth of topography of the etched substrate below.

Accordingly, the ability to achieve high resolution lithography without the need for high energy lasers is desirable.

An object of the present invention is to mitigate some of the deficiencies of the prior art mentioned above.

SUMMARY OF THE INVENTION

In a first aspect of the invention, there is provided a method of photoexcitation comprising the steps of providing a composite, the composite comprising a first material having at least a first energy level and a second energy level, and a second material having at least a first energy level and second energy level, wherein the energy gap between the first and second energy level of the first material is less than the energy gap between the first and second energy level of the second material, and wherein the first material and second material are in communication with one another, providing a photon source configured to emit a photon, wherein the energy of the photon is equal to or greater than the energy gap of the first material but less than the energy gap of the second material, exposing the composite to the photon such that an electron is excited from the first energy level of the first material to the second energy level of the first material, and wherein said electron transfers from the second energy level of the first material to the second energy level of the second material.

Providing a composite with the energy level structure described above allows for an electron to be excited into the second energy level of the second material indirectly via a lower energy excitation in the first material. This lower energy excitation requires less energy than a direct excitation from the first energy level of the second material to the second energy level of the second material, and can be accomplished using photons with an energy lower than the energy gap of the second material. As such, the need for high energy photons (photons with an energy equal to or greater than the energy gap of the first material) is obviated, along with their associated disadvantages as noted above.

Typically the second energy level of the first material is substantially equal to the second energy level of the second material. This improves the ease of electron transmission between the first and second materials.

The term 'energy level' refers to the quantised, discrete values of energy of bound particles in quantum mechanical systems, typically electrons. These include the lowest energy level, otherwise known as the ground state or zero point energy. These levels may also be referred to as energy shells or simply shells. The "first energy level" described above for both the first and second material may be the ground state i.e. the zero point energy of the materials or a higher energy level. The first and second energy levels of the first and second materials do not necessarily need to be the lowest and highest energy levels associated with those materials respectively. It is however typically the case that the second energy is higher than the first energy level in a given material.

Further the 'energy gap', referred to herein is the energy range, or the distance in energy space between the discrete energy levels defined above. This could also be described as the difference in energy between two discrete energy levels.

Reference to 'electron transfer' in the specification refers to the process by which the electron in the second energy level of the first material moves to the second energy level of the second material. This may also be referred to as 'energy transfer', 'photosensitization' or the first material donating an electron, the second material receiving an electron, or the second material absorbing energy from the first material.

It is important that the first and second material are 'in communication' with each other. The skilled person will appreciate that if the first and second materials are isolated from one another, it is not possible for any electron transfer to occur. Therefore, the term, in communication" is intended to describe that the first and second materials are able to transmit and receive respectively an electron as described above. Accordingly, the two materials could be connected via a single interface at which the reaction can occur or may involve dispersing one material within another to maximise the contact area between the two materials.

Typically the first material further comprises one or more intervening energy levels between the first and second energy levels of the first material and wherein the energy of the photon is equal to or greater than the energy gaps between each of the energy levels of the first material but less than the energy gap of the second material.

Reference to 'intervening energy levels', is intended to mean energy levels located on the energy scale between the first and second energy levels of the first material.

This enables an electron to reach the second energy level of the first material by a series of smaller steps through the energy levels in the first material. Once promoted to the second energy, via the intervening energy levels, the electron can transfer from the first material to the second energy level of the second material. By providing more "rungs" to this energy level ladder, an electron can be excited up the levels by a plurality of photons each photon having a much lower energy than the energy gap between the first and second energy levels of the second material, in what is called a multi-stage photoexcitation. These lower energy photons are easier to generate and, unlike high energy photons, do not cause collateral damage to material, are not absorbed by air and have a good depth of focus.

This multi-stage photoexcitation process requires the photon flux to be above a certain threshold such that electrons in the first material can be continually promoted into higher excited states (i.e. gaining higher energy levels) until they can transfer into the second material, without decaying back down to their initial, unexcited energy state, or ground state.

The term 'low energy photons' or 'lower energy photons', is intended to describe photons having an energy less than the energy gap between the first and second energy levels of the second material. In other words, photons that are incapable of directly exciting an electron from a first energy level of the second material into a second energy level of the second material.

Typically the photon source is a laser. This allows for the provisions of a controllable source of photons of consistent energy. Further, the exposed area of the composite can be set by the spot size of the laser. Both the spot size and/or the wavelength of the laser can be varied as desired. Furthermore, the pulse duration and/or pulse amplitude of the laser can also be varied. By varying these parameters, it is possible to vary the exposure of the composite material and adjust the dimensions of the resulting features on the substrate. There is no particular limitation on the photon source used and indeed the use of any source of a focused light beam is envisaged. As discussed above, a threshold exists in the photon flux, above which the photosensitization process will commence. By using a photon source which has a Gaussian beam profile, the photon source can be tuned such that only the very centre of the beam is above this threshold. This allows for the photosensitization of an area of the second material smaller than the spot size of the photo source. In the case where the composite is a photoresist used in photolithography, this leads to an increases in the resolution of the features attainable.

Typically the laser is operated in a continuous wave mode. This provides a steady, constant and controllable stream of photons to the composite.

Typically the laser is a diode laser. Diode lasers typically require less power than most gas or chemical laser systems.

Typically the first material is an aromatic molecule. Typically a polyaromatic molecule. The inventors have found that such molecules are useful photosensitizers, having an energy level structure that makes it well suited as a first material in the claimed invention.

Typically the first material is a dye. The term "dye" is intended to refer to any compound which has an energy level structure as described above for the first material. Typically, the "dye" is an organic dye. Reference to "organic dye" is intended to cover those compounds containing a chromophore i.e. a group responsible for producing colour. Typically, these groups are aromatic regions of a molecule which absorb radiation. Although term "chromophore" typically relates to regions responsible for colour, it is also envisaged that such groups may be suitable for absorbing radiation outside the visible spectrum.

Typically the dye is a perylene or a coumarin. Typical examples of dyes include aminoanthracene or anthracene. The inventors have found that these molecules have an energy level structure that makes them well suited as a first material in the claimed invention. Reference to "perylenes" or "courmarins" herein is intended to cover the specific compound (e.g. perylene) and also those compounds including said compounds, usually as a chromophore, such as perylene-3,4,9,10-tetracarboxylic acid ("Vat Red 29") as well as derivatives of said compounds.

The first material may be provided as particles, typically micron particles and more typically nanoparticles. Where the first material is a particle, the diameter of the particle is typically less than 2 μm, more typically less than 1 μm, even more typically less than 500 nm, and more typically still less than 100 nm. Alternatively, the first material may be provided in a molecular form, for instance as a liquid or as a solution in which the first material is dissolved. By further reducing the particle size, the resolution limit of the photoresist is further decreased and the achievable feature size is further reduced.

The ratio of the first material to the second material in the composite is not particularly limited. However, it is typically the case that the amount of second material is greater than the amount of first material. Typically, the composite comprises less than 50% by weight of the first material, more typically less than 45%, more typically less than 40%, more typically in the range 1 to 40%, more typically, 5 to 30%, more typically 5 to 10%.

Typically the second material is one of a polymer, photo acid generator, photo radical generator, photo base generator or other photodegradable material. When these materials are exposed to high energy electrons via the claimed energy transfer mechanism (or sensitised), this typically promotes a chemical change via the breaking of chemical bonds. Accordingly, the process can be used to impart electrons to very small regions of the second material thereby promoting chemical changes in very specific regions of the second material. There is no particular limitation on the material used and indeed other such molecular materials are envisaged that have bonds which can be broken using this electron transfer mechanism. Similarly mixtures of one or more polymers, photo acid generators, photo radical generators and photo base generators are also envisaged. The polymer may be a co-polymer, such as a block or random copolymer. The polymer may be functionalised to include moieties adapted to receive an electron or react on receipt of an electron from the first material.

Examples of typical polymers suitable for use in the present invention include, but are not limited to; polyacrylates, polyamides, polyimides, polyesters, polyethers, or combinations thereof.

Typically the first material is suspended in the second material. The term "suspended" as used herein is intended to cover a range of different distribution profiles. The first material may be uniformly distributed throughout the second material, or alternatively it may be located partially or continuously across a surface of the material. The first material may also be predominantly located in a particular area or plane or face of the second material. This facilitates electron transfer from the first material to the second material and defines the areas of the second material which receive an electron from the first material.

Typically the composite is a photoresist for use in a photolithography method. Further, the method is typically a photolithographic method. Typically, the photoresist is deposited over a substrate. When the second material receives an electron into its second energy level it becomes chemically differentiated from the rest of the photoresist. Depending on the desired application and the second material, this chemically differentiated material may either be developed and removed leaving the unexposed material on the substrate (in the case of a positive photoresist), remain on the substrate whilst the unexposed photoresist is removed (in the case of a negative photoresist), or preferably degrade in situ as a result of the absorbed energy and expose the underlying substrate to further processing (such as ablation by the photon source), allowing for direct laser writing of the substrate, with fewer processing steps than conventional photolithography.

In a second aspect of the invention, there is provided a photolithographic composition comprising a first material having at least a first energy level and a second energy level, and a second material having at least a first energy level and second energy level, wherein the energy gap between the first and second energy level of the first material is less than the energy gap between the first and second energy level of the second material, and wherein the first material and second material are in communication with one another, wherein the first material is provided as particles having a diameter less than 2 μm.

The advantage of such a composition over existing photoresists is that a greater degree of fidelity is achieved in modifying the second material. Existing photoresists are restricted as to the size of structures that can be achieved by the energy and wavelength of the laser which performs the ablation. By using particles of a size smaller than the wavelength of conventional ablation laser techniques, smaller structures can be achieved than with conventional photoresists.

By limiting the particle size to less than the minimum resolution of the laser, one can reduce the area in which the second material undergoes indirect photoexcitation and resulting degradation. Accordingly feature size is limited not by the laser wavelength and the corresponding spot size, but by the particle size and concentration of the first material. This leads to an increased patterning resolution and a corresponding increase in the resolution of the resulting features on the substrate.

The term 'indirect photoexcitation', refers to the process by which the second material gains an electron in its second energy level via a photoexcitation from the first energy level of the first material to the second energy level of the first material.

Typically the particles of the first material are suspended in the second material and are typically dispersed uniformly throughout the second material. The particles of the first material may also be predominantly located in a particular area or plane or face of the second material. This facilitates electron transfer from the particles of the first material to the second material and defines the areas of the second material which receive an electron according to the distribution of the first material.

In one embodiment, the first material be bonded to the second material. For instance, the first material may be covalently bonded to the second material. This ensures close proximity between the first material and the second material. Alternatively, the particles may be nanoparticles associated with a particular functionality of the second material. This is particularly advantageous where the second material is a polymer. By attaching the first material to a polymer, this ensures an even distribution of the first material throughout the second material and can provide for a sufficient density of the first material such that all of the second material can undergo indirect photoexcitation. Moreover, this prevents over-saturation and aggradation of the first material.

Alternatively, the second material may be doped with the first material. This enables the concentration of the first material to be precisely controlled along with its precise distribution via methods such as selective doping. By better defining the location of the first material within the second material, one can vary the location and concentration of the resulting exposed portions of the second material and the resulting features on the substrate.

Where the composition is a photoresist, it is typically the case that the photoresist is deposited over a substrate.

Other aspects of the invention will be apparent from the following description, examples and the appended claim set.

BRIEF DESCRIPTION OF THE DRAWINGS

Embodiments of the present invention will now be described, by way of example only, with reference to the accompanying drawings, in which.

DETAILED DESCRIPTION

In order to provide for indirect photoexcitation whereby a large energy gap between energy levels in a second material is circumvented by a series of lower energy photoexcitations in a first material, there is provided a method of photoexcitation in accordance with the present invention.

Figure 1:
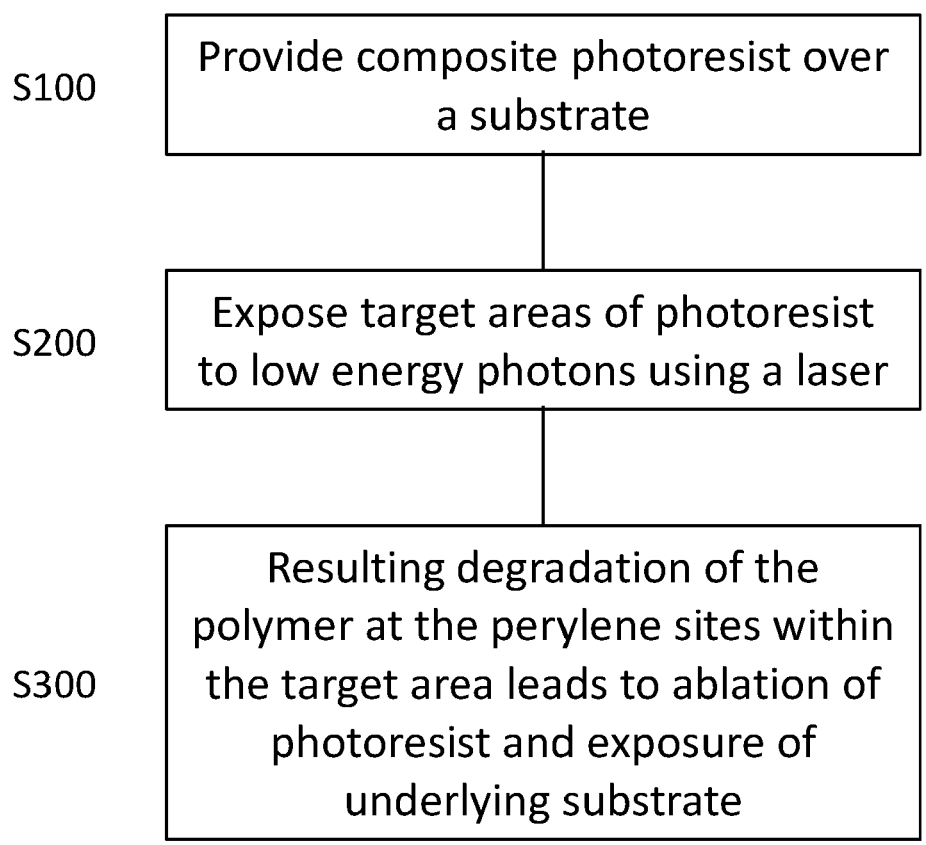
FIG. 1 is a flow chart of the method in accordance with an embodiment of the invention.

FIG. 1 shows a flowchart of the method steps performed to achieve photoexcitation according to an embodiment of the invention.

The process commences at step S100 wherein a composite 10 is provided as a photoresist 20 spin coated onto a substrate 30. The composite 10 is formed of perylene molecules 40 in a polymer 50 matrix.

At step S200, targeted areas of the composite 10 are exposed to low energy photons 60 provided by a laser 70. The Laser 70 is a 375 nm diode laser operating in continuous wave mode. The laser 70 is focused to provide a diffraction limit spot size on the surface of the composite 10, defining the target area. The perylene molecules 40 within this area absorb electrons having an energy related to in the exposing laser wavelength, whereas the polymer 50 is transparent.

At step S300, the polymer 50 matrix around the sites of the perylene molecules exposed to the low energy photons 60 from the laser 70 undergoes polymer degradation leading to ablation of the photoresist 20, exposing the underlying substrate 30 to the laser 70 and allowing the substrate 30 to be patterned directly. The resulting features created on the substrate 30 have dimensions below the 50 nm domain, well below the laser wavelength.

Without being bound by theory, it is believed that the perylene molecules 40 absorb the low energy photons 60 and undergo a multi-stage photoexcitation. In this multi-stage photoexcitation, an electron occupying an energy level in a perylene molecule 40 absorbs an incident low energy photon 60 and is promoted to a higher energy level (and therefore gaining energy). The continuous wave nature of the laser 70 allows for this electron to undergo further photoexcitations before it is able to re-emit the low energy photon 60 and return to its original energy level. This is enabled by the photon flux being above a threshold necessary for continuous electron promotion. Therefore the electron continues to advance upward through energy levels (and energy) until it occupies an energy level of the perylene molecule 40 that is substantially equivalent in energy to an energy level of the surrounding polymer 50. At this stage, the electron transfers from perylene molecules 40 into the surrounding polymer 50 which then degrades. Thus the polymer 50 is photosensitized by the perylene molecule 40, which acts as a photosensitizer. Accordingly the minimum feature size is not set by the laser 70 wavelength, but by the size and distribution of the absorbing perylene molecules 40 and the characteristic distance over which the high energy electron can transfer between the perylene molecule 40 and the surrounding polymer 50.

Figure 2A:
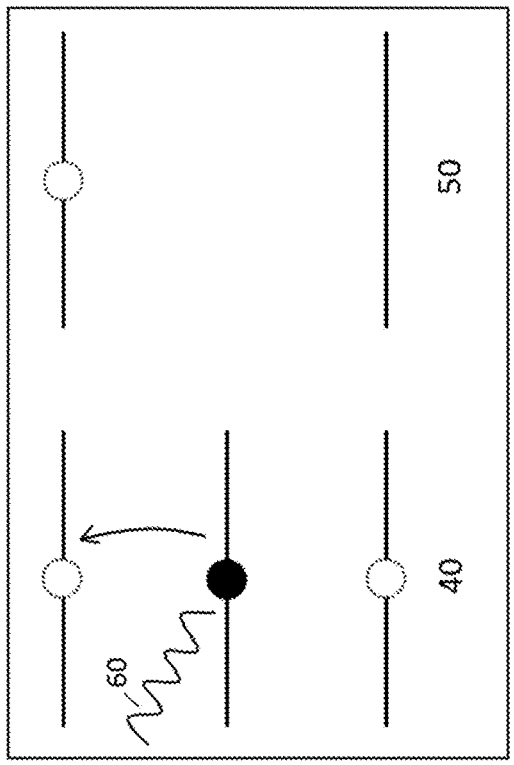
FIG. 2 is an energy level schematic of the composite.
Figure 2B:
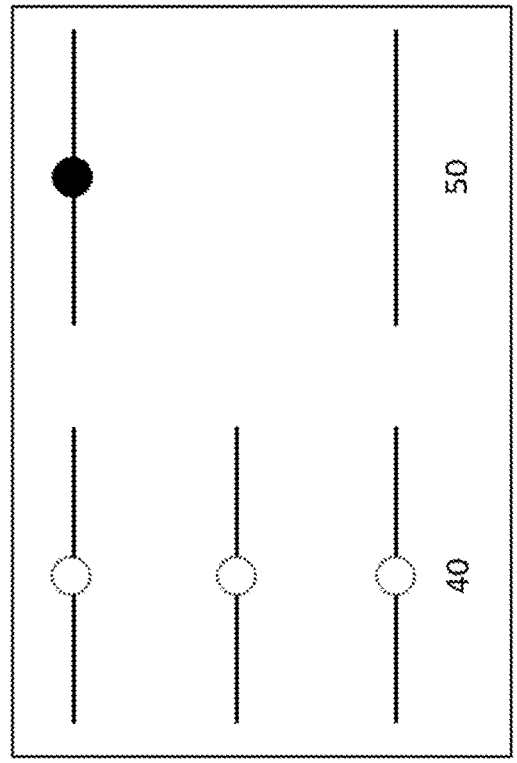
Figure 2C:
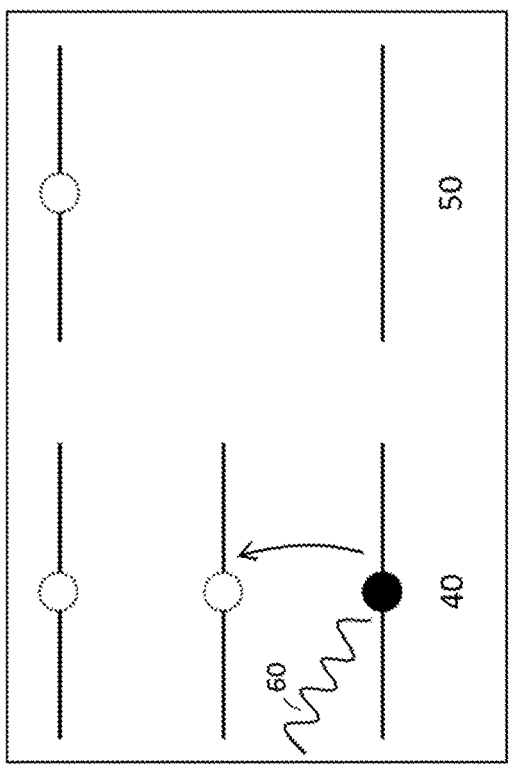
Figure 2D:
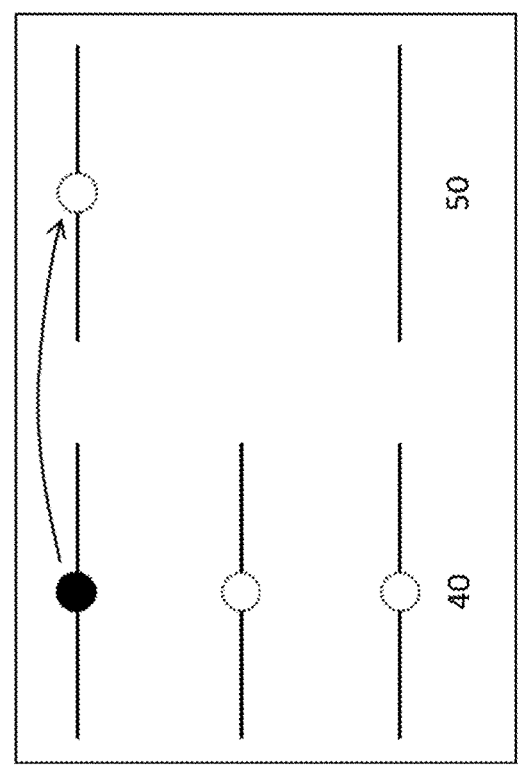
Figure 3:
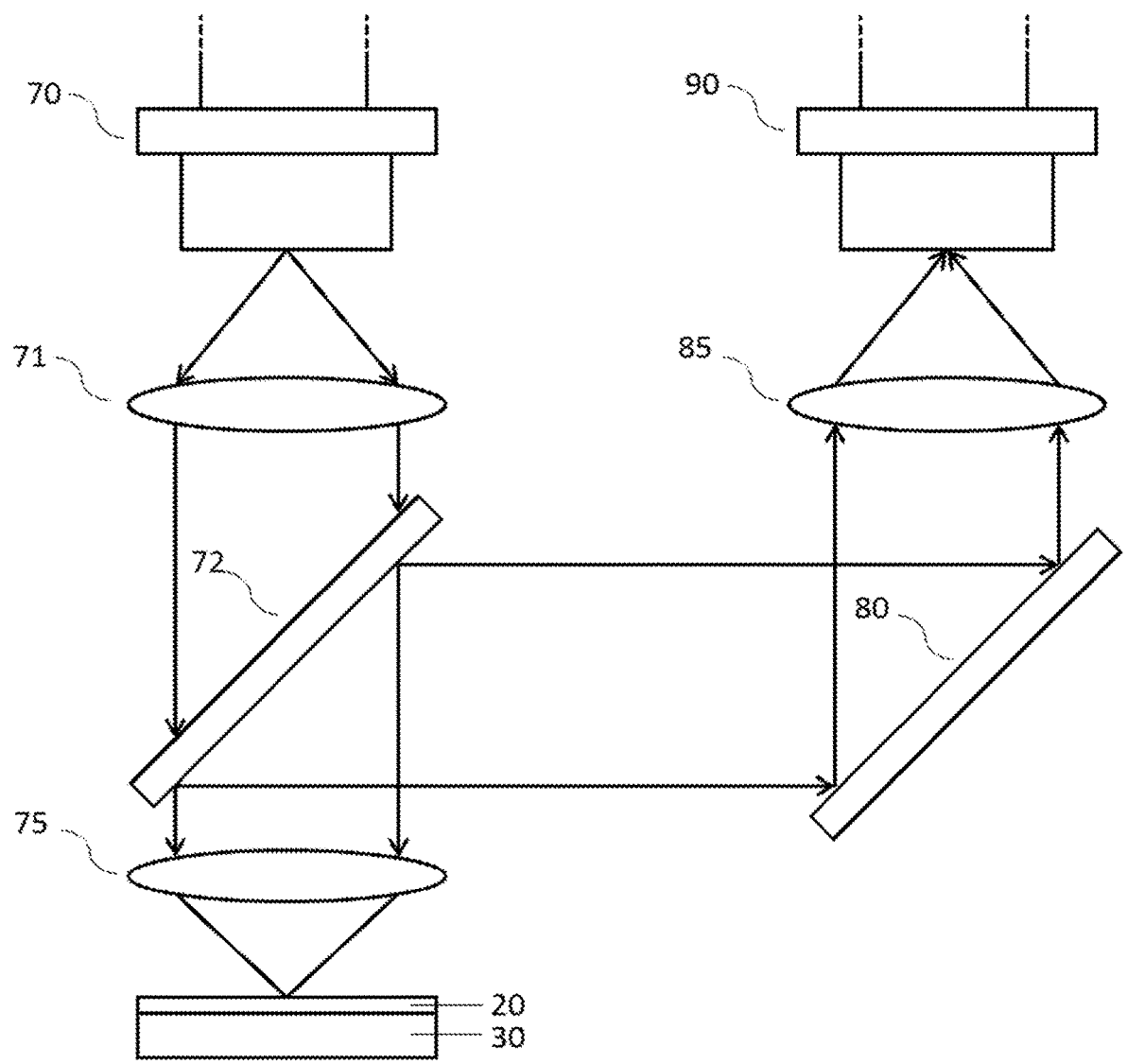
FIG. 3 is a schematic drawing of the laser writing setup.

This process is illustrated in FIG. 2a-2d which shows an energy level schematic of the perylene 40 and polymer 50. FIG. 2a show the first stage of the process, with an electron in the perylene 40 undergoing photoexcitation to the energy level above. This is repeated in FIG. 2b, with the electron continuing up the energy levels. FIG. 2c shows the now high energy electron being transferred between an energy level of the perylene that is substantially equal in energy to an energy level of the polymer 50, thus the polymer 50 absorbs the high energy electron.

The composite 10 is formed by doping the polymer 50 with 5% perylene (with respect to the polymer weight).

Figure 4:
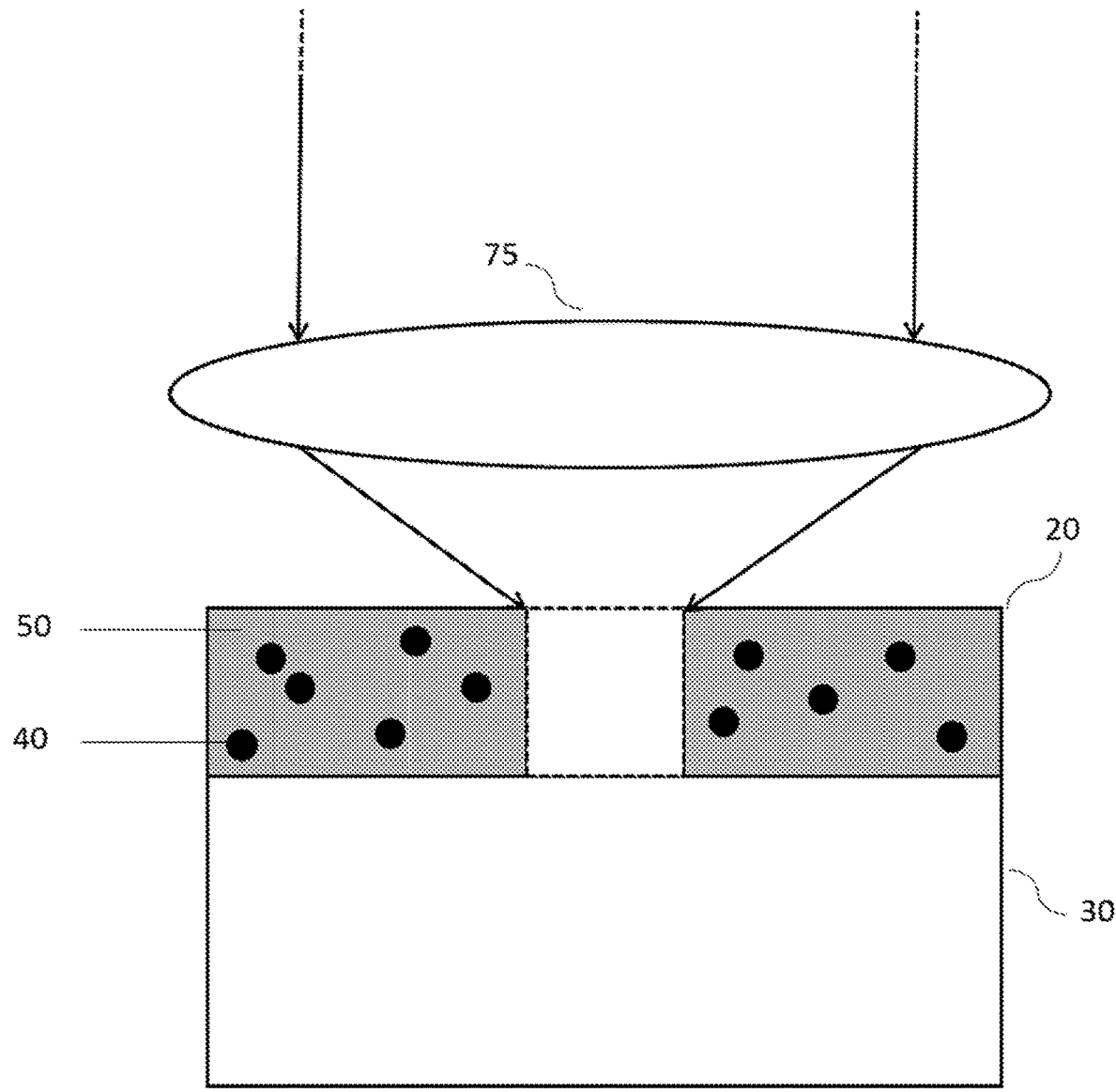
FIG. 4 is an illustration of high resolution structure formation by using only a small part of the laser focused spot in non-linear response materials.
Figure 5A:
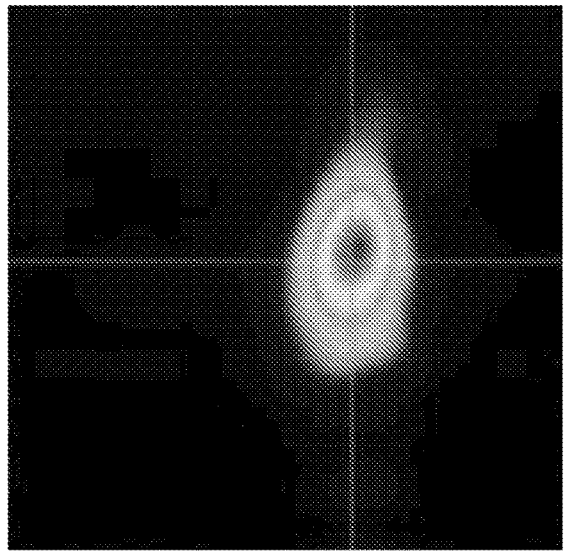
FIGS. 5a and 5b show astigmatism along XY uncorrected diodes.
Figure 5B:
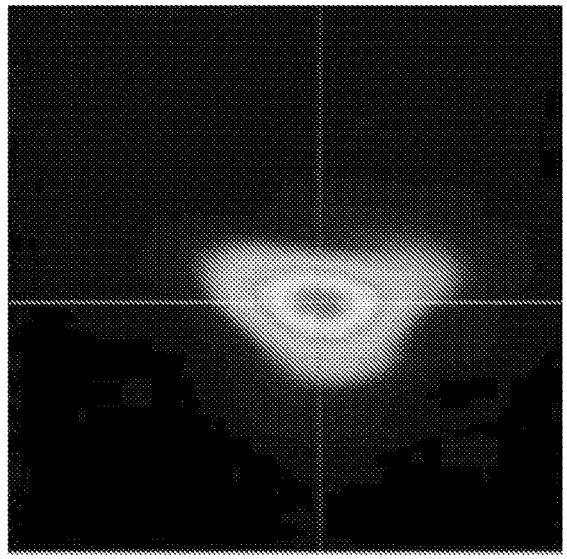
Figure 6A:
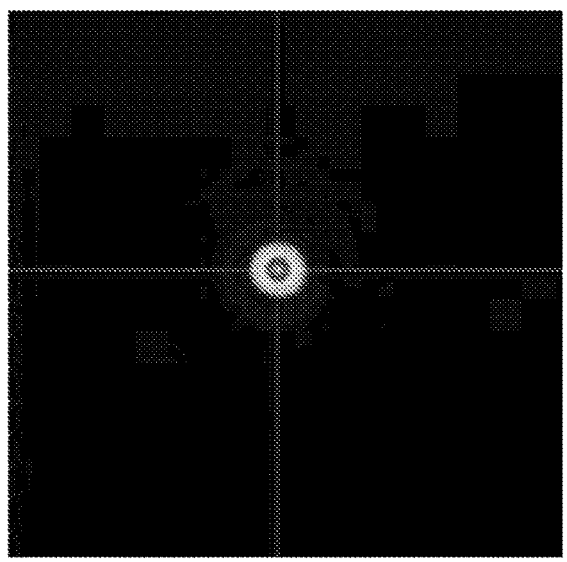
FIGS. 6a and 6b sow astigmatism along XY correct diodes.
Figure 6B:
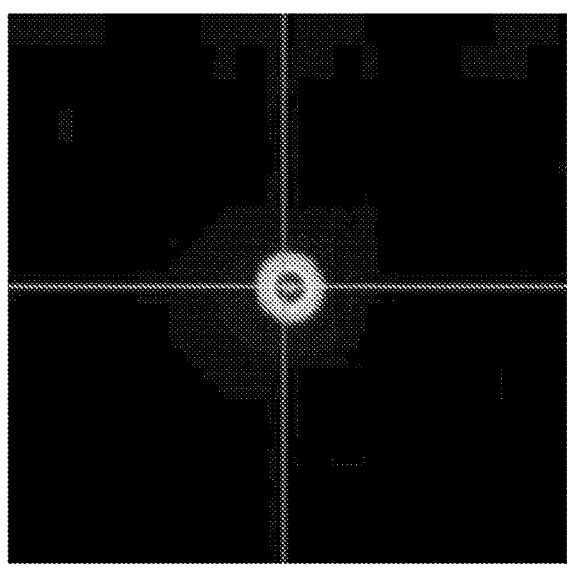

FIG. 4 shows the laser ablation setup. The direct-write system used to selectively expose the photoresist incorporated an air-bearing/precision mechatronic stage. A rotary spindle carried the coated spin-coated substrate by means of a vacuum clamp, a linear stage translated the laser 70 and optics above and across the substrate, and a focusing actuator held the high numerical aperture (NA) objective lens 75 properly positioned.

An exposing laser beam from the 375 nm diode laser was collimated using a lens 71, passing through a partial mirror 72, before being precisely focused onto the surface of the photoresist 20 through the high NA objective lens 75 and the beam was rastered over the desired areas of the photoresist and the underlying substrate.

Light reflected off of the partial mirror 72 is directed by a second mirror 80 through a second lens 85 into a photo detector 90 to allow for feedback driven autofocusing of the laser 70.

EXAMPLES

2. Experimental

2.1 Materials

All solvents and reagents were purchased from Sigma or Alfa Aesar and were of analytical or HPLC grade.

Tetrahydrofuran (THF) was distilled three times from potassium. The monomers were passed over a column of basic alumina to remove the inhibitors and protonic impurities. Two distillations over calcium hydride and 2,2-Diphenyl-1-picrylhydrazyl (Aldrich) provided monomers of sufficient purity.

2.2 Polymerizations

Polymerization reactions were carried out in 250 ml one neck flasks fitted with a rubber septum and a magnetic stirrer bar. The monomers and the solvent (typically tetrahydrofuran (THF)) were transferred in the reaction flask via syringes. Then, the radical initiator (typically AIBN Azobisisobutyronitrile) were added and the flask were heated at 60° C. The polymerizations were being carried out for 8 hours. The final polymer was obtained by precipitation of the reaction mixture in cold hexane and the product was dried under reduced pressure.

2.3 Preparation of Thin Films

Glass substrates were cleaned by sonication in acetone and isopropanol for 5 min each, dried under a $N_2$ gas flow and baked for 2 min at 120° C. in an ambient atmosphere to remove any residual IPA. The random copolymers were dissolved in ethyl lactate and PGMEA at room temperature to yield 2.0, 3.0 and 5.0 wt % polymer solutions. Random copolymer thin films were fabricated by spin coating a polymer solution at 1000-2000 rpm for 120 seconds. Prior to spin coating, the silicon substrates were primed 2 times by spin casting ethyl lactate or PGMEA (2000, 120 seconds). After spin coating, the block copolymers thin films were baked for 30 min at 100° C. on an oven to remove any residual solvent.

2.4 Laser Ablation Writings

The direct-write system used to selectively expose the thin films was an air-bearing/precision mechatronic stage, developed in-house for the purposes of the project, in r-theta-z setup. A rotary spindle carried the coated substrate under test (theta)—by the means of a vacuum clamp—, a linear stage (r) translated the laser and optics above theta and across the substrate radii, and a focusing actuator (z) held the final/high-NA objective properly positioned.

The film exposing laser beam (375 nm diode laser) was precisely focused, through a high NA objective, resulting in the formation of a diffraction limited spot on the surface of the substrate. Throughout the experimentation process a better than 1% (±0.5%) focusing error was maintained, using the focused spot FWHM diameter as a reference, and measuring error in the back-reflected (from the test substrate) beam divergence variation.

The optical arrangement used to setup and focus the exposing laser beam was individually tested for beam astigmatism and Gaussian beam profile uniformity along X and Y axes, and corrected, as depicted in FIGS. 5a and 5b and 6a and 6b. The setup used for testing involved focusing the exposing beam on a two (10× and 100×) infinity corrected microscope objective system, effectively magnifying it by three orders of magnitude, and projecting the up-scaled beam to a beam profiling camera (Neutral Density filters were additionally used to adjust laser power to profiling camera acceptable levels).

The combined rotary-linear motion of the exposure tool stages allowed the focused beam to scan the substrate surface with a constant linear velocity of 5.00 m/s in a spiral mode, while the exposing laser was directly modulated both in pulse duration and in amplitude, forming holes with adjustable dimensions on the film.

Various pulse modulation patterns were tested. The pulse duration/amplitude resolution of the exposure tool used was 10 ns/0.01 mW respectively.

The laser-processed film subsequently underwent thermal evaporation and electroplating treatments for topography inverting the originally made holes on the film into Ni pillars.

3. Results and Discussion

3.1 Polymeric Materials Design and Properties

Figure 7:
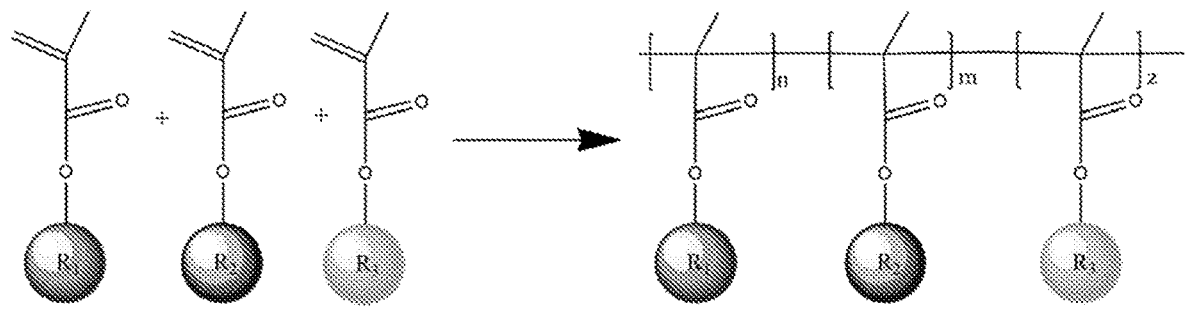
FIG. 7 is a representation of the formation of a copolymer useable in the invention.

FIG. 7 shows the structure of the designed random copolymers synthesized by free radical polymerization. The monomers selected in the direction to improve specific properties of the final random copolymers. Random copolymers consisted of about 85% of the monomer R1, about 10% of the monomer R2 and about 5% of the monomer R3. Monomer R1, which is the main component of the random copolymer, gives properties such as glass transition temperature control, improved surface adhesion, solubility and compatibility with other substances. Monomer R2 was selected to improve the compatibility between the random copolymer and the dispersed dye molecules. Finally, the monomer R3 is a functional monomer that can be cross-linked during the post-apply-bake step increasing the Tg of the random copolymer thin film in order to eliminate the berm formation around the created structures.

Five random copolymers were synthesized with different amounts of the monomers R1, R2 and R3. Table 1 contains the composition of these random copolymers as well as the molecular characteristics. The molecular weights of the random copolymers were about 50 KDa and the polydispersities were up to 2.35.

TABLE 1 compositions and molecular characteristics of the synthesized random copolymers.

| Polymers | R1 (% moles) | R2 (% moles) | R3 (% moles) | Mn | PD |
|---|---|---|---|---|---|
| Polymer 1 | 100 | 0 | 0 | 45000 | 2.25 |
| Polymer 2 | 90 | 10 | 0 | 44000 | 2.15 |
| Polymer 3 | 85 | 10 | 5 | 49000 | 2.30 |
| Polymer 4 | 88 | 10 | 2 | 51000 | 2.25 |
| Polymer 5 | 89 | 10 | 1 | 48000 | 2.35 |

3.2 Polymeric Thin Films Preparation

Figure 8:
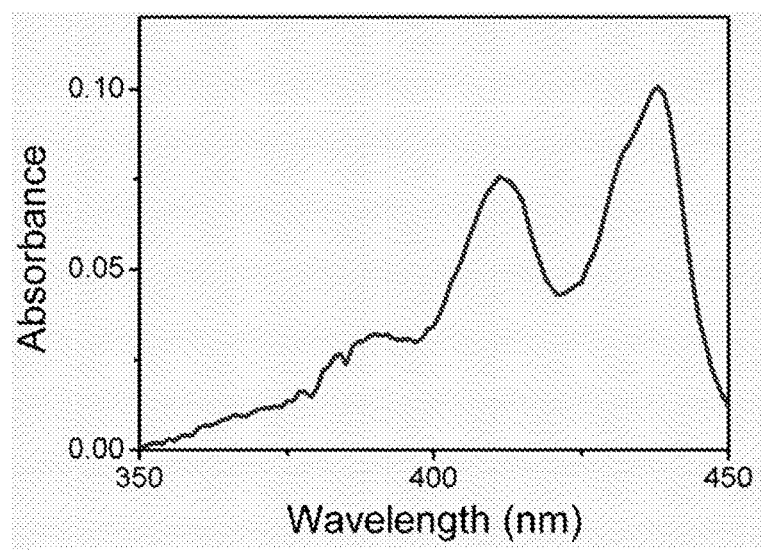
FIG. 8 shows UV-Vis spectrum of a random copolymer thin film doped with 5% perylene.

The dye used for doping the random copolymers was perylene. Perylene is a polyaromatic molecule which does not photodegrade during the laser ablation process. The random copolymers were doped with Perylene in 3, 4 and 5% with respect to the random co-polymer weight. The polymeric material doped with 5% Perylene had the proper amount of the dye to trigger the ablation process. FIG. 8 contains a UV-Vis spectrum of a polymeric material doped with 5% Perylene. Absorbance of the doped random polymer at 375 nm, which is the wavelength of the laser used for ablation, does not exceed 0.02.

Figure 9A:
FIGS. 9a and 9b show a thin film of polymers 1 and 2 respectively.
Figure 9B:
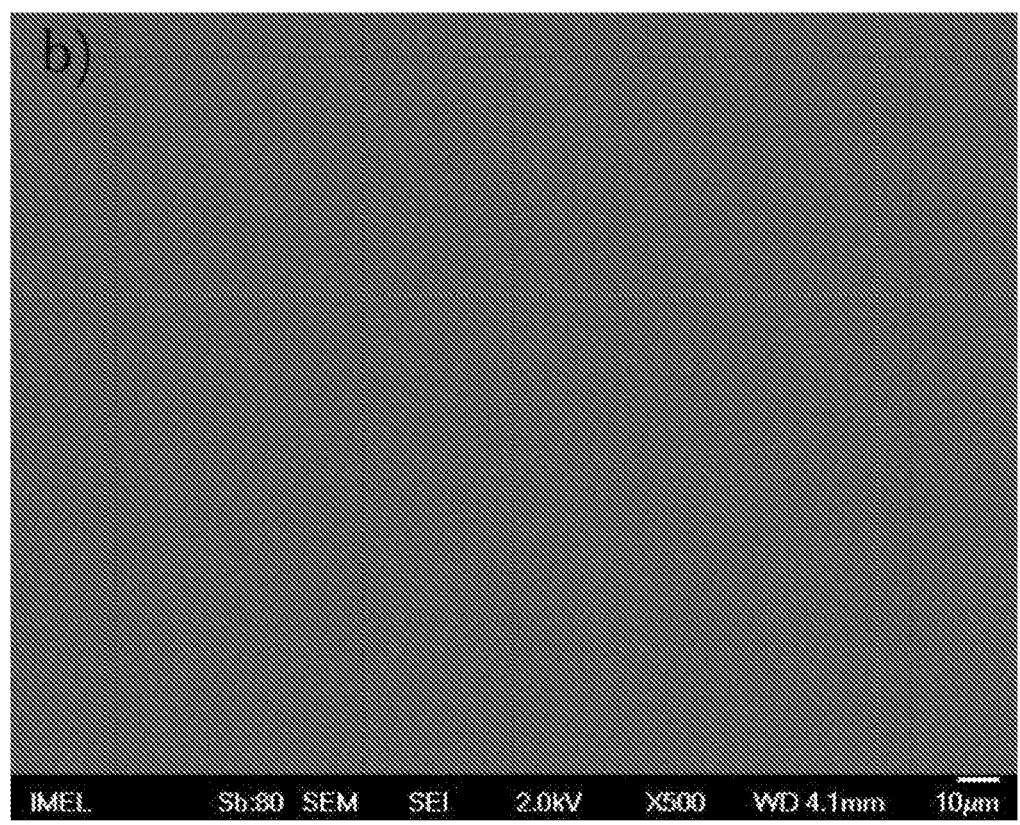

Polymer 1 thin films were made by spin coating, the concentration of Perylene molecules was 5% with respect to polymer's weight. As it is shown in FIG. 9a, the thin films contained regions with dye aggregations, caused by the chemical incompatibility between the polymeric matrix and the dye molecule. The perylene molecules tend to crystallize, due to their aromatic nature, and if the concentration of the dye exceeds 3% with respect to the polymer's weight, regions with crystallized perylene aggregates appear. By introducing groups that improve the compatibility between the polymer matrix and the perylene molecules into the polymer's backbone, this behavior can be eliminated. Polymer 2 contains 10% of monomer R2, with respect to the polymer, which is selected to have chemical similarities with perylene molecules, delivering better dye distribution into the polymeric matrix and eliminating the dye aggregation problem. A thin film of polymer 2 doped with 5% perylene, with respect to the polymer's weight, appears in FIG. 9b. The film does not contain any dye aggregation defects and can be used for laser processing.

3.3 Laser Characteristics

Figure 10:
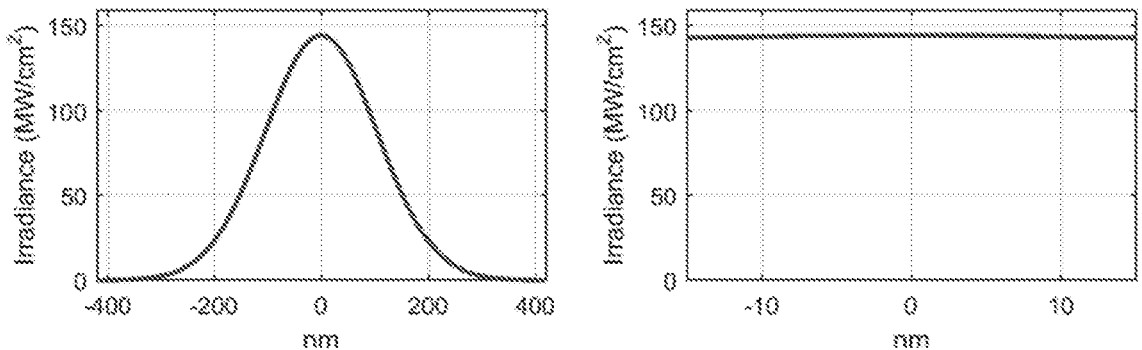
FIG. 10 shows a simulation on irradiance encircling $2 \times 1/e^2$ and 30 nm diameters.
Figure 17:
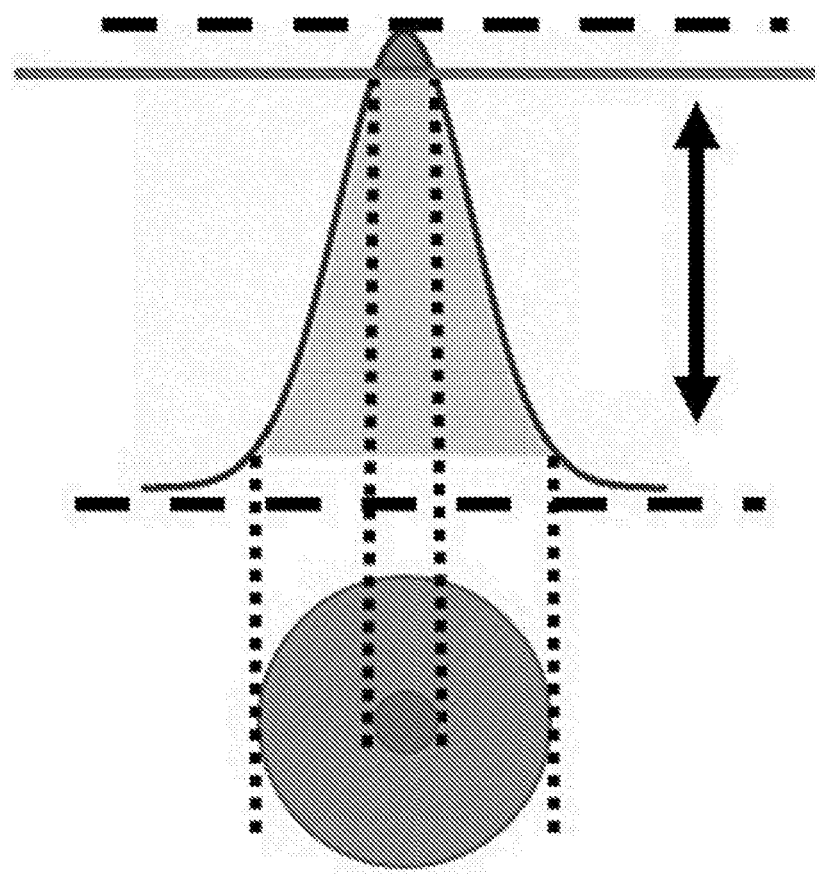
FIG. 17 shows a cross-section of a laser beam and corresponding intensity which follows a Gaussian distribu-

In order to improve our understanding on the Laser characteristics effecting the process, a simple MATLAB simulation was developed to quickly estimate Laser spatial-temporal parameters at the focal point during tests, as shown in FIG. 10. The simulation was capable of accepting laser beam power set-point (mW) and focused spot diameter (nm at 1/e2), delivering: irradiance (MW/cm2) across a circle with diameter 2×1/e2 diameter, and along a circle with a diameter equal to a diameter of interest (ROI). 2×1/e2 irradiance was used for comparing direct measurements of the focused beam (after ×1000 magnification) on the beam profiler, irradiance across ROI was helpful to estimate the energy flux threshold that was triggering the ablation process on the test films of various chemical compositions. As discussed above, the Gaussian laser beam profile enable a setup in which only the very centre of the beam is above this threshold, as depicted above FIG. 17.

Focused laser beam profile, as measured by the beam profiler, matched the MATLAB/theoretical calculated profile (for the given laser source wavelength, and the 0.90 NA objective lens used) within the measurement uncertainty range:

| | | |
|---|---|---|
| Calculated | FWHM (XY) 247.3 nm | FWE2 (XY) 420.0 nm |
| Measured (scaled ×1000) | FWHM (X) 255 µm | FWHM (Y) 262 µm |
| Measured (scaled ×1000) | FWE2 (X) 419 µm | FWE2 (Y) 427 µm |

By feeding actual feature dimensions (measured by SEM) of experiment results back to MATLAB, we were able to get detailed graphical representations of irradiance, power (the later by integrating irradiance over ROI) and energy around areas equal to the ablated ones during exposure time.

Figure 11:
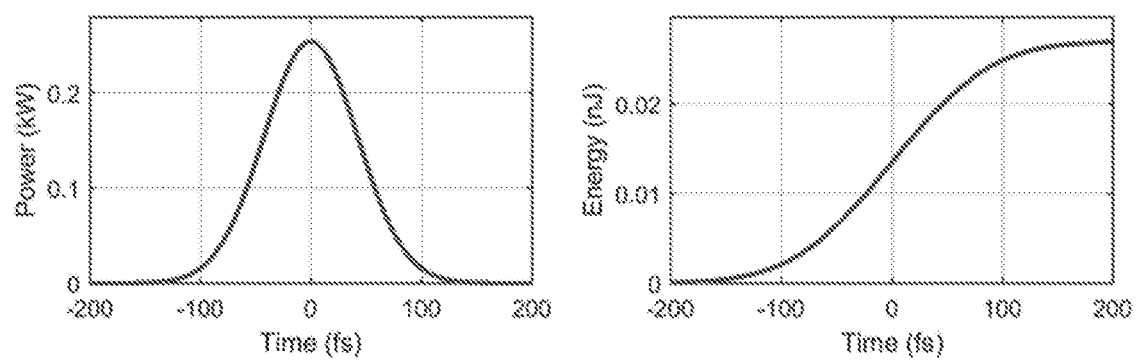
FIG. 11 shows a calculation of irradiance and power differences between continuous wave and pulsed laser operation.

Additionally we calculated irradiance, power and energy for a pulsed laser equivalent of the CW laser used, as shown in FIG. 11, delivering the power of our laser over a single pulse, keeping the rest of the operational parameters the same. Calculations covered various repetition rates and typical temporal pulse profiles (Gaussian, exponential and squared hyperbolic secant), to confirm the unique exposure conditions of the test, compared to the commonly used on ablation experiments, pulsed lasers.

Formulas used to calculate Power, integrated over time for calculating each pulse energy, and multiplied by the repetition rate to calculate total energy:

$$P_P = P \times FWHM \times f,$$

$$P_{EXP}(t) = P_P \cdot 4 \cdot \ln(2) \left(\frac{t}{FWHM}\right)^2 \cdot \exp\left(-\frac{t}{FWHM}\right)$$

$$P_G(t) = P_P \cdot \exp\left[-4 \cdot \ln(2) \cdot \left(\frac{t}{FWHM}\right)^2\right]$$

$$P_{SECH}(t) = P_P \cdot \text{sech}^2\left[2\ln(1+\sqrt{2})\frac{t}{\tau}\right]$$

$$E_G(t) = \frac{P_P \cdot FWHM}{4 \cdot \sqrt{\ln(2)/\pi}}\left[1 + \text{erf}\left(\frac{t}{FWHM}\right)\right] \to E_G(\infty) = \frac{P_P \cdot FWHM}{2 \cdot \sqrt{\ln(2)/\pi}}$$

$$E_{EXP}(t) = P_P \cdot 4 \cdot \ln(2) \cdot FWHM\left[\frac{\sqrt{\pi}}{4}\text{erf}\left(\frac{t}{FWHM}\right) - \frac{t}{2FWHM}e^{-\left(\frac{t}{FWHM}\right)^2}\right] \to$$

$$E_{EXP}(\infty) = P_P \cdot \sqrt{\pi} \cdot \ln(2) \cdot FWHM$$

$$E_{SECH}(t) = \frac{P_P \cdot FWHM}{2 \cdot \ln(1+\sqrt{2})}\left[1 + \tanh\left(\frac{t}{FWHM}\right)\right] \to E_{SECH}(\infty) = \frac{P_P \cdot FWHM}{\ln(1+\sqrt{2})}$$

3.4 Materials Evaluation

Figure 12:
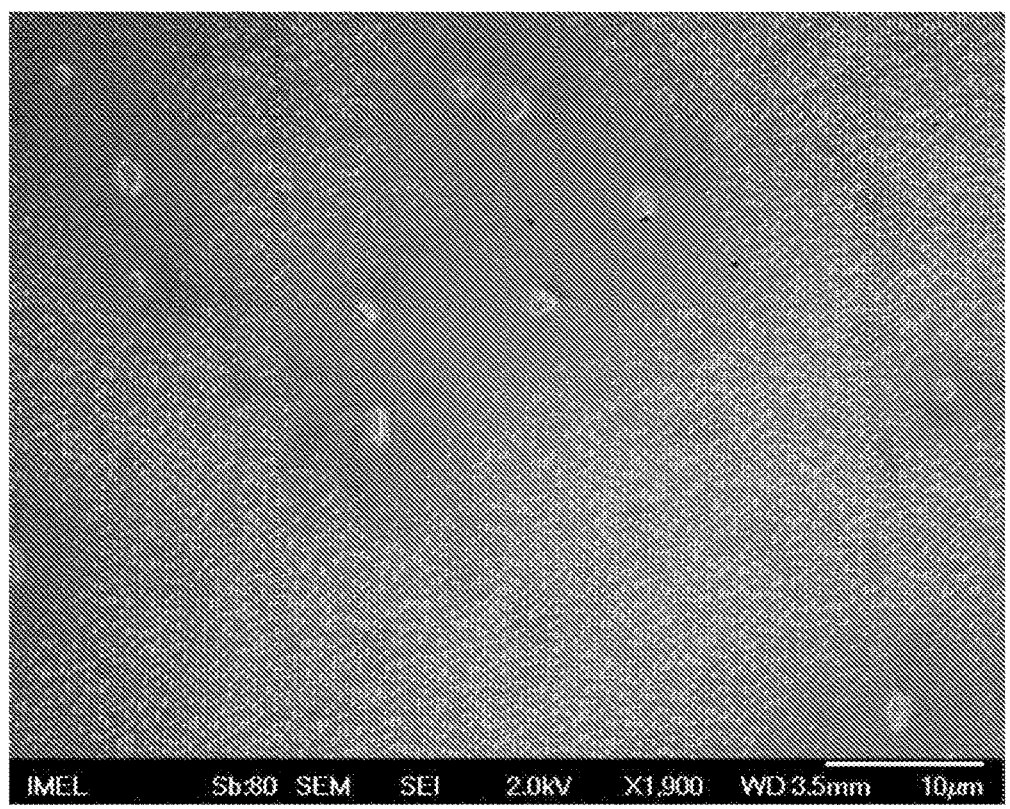
FIG. 12 shows a thin film of polymer 1 written by LBR after nickel metallisation.

As shown in the FIG. 12, in the regions of the polymeric thin film (polymer 1) where the dye molecules were aggregated, the film remained untouched after exposing it with the laser, due to the lack of dye molecules in these areas. Furthermore, the big aggregates strongly effected/downgraded the quality of inverting the originally made holes on the film into Ni pillars.

Figure 13:
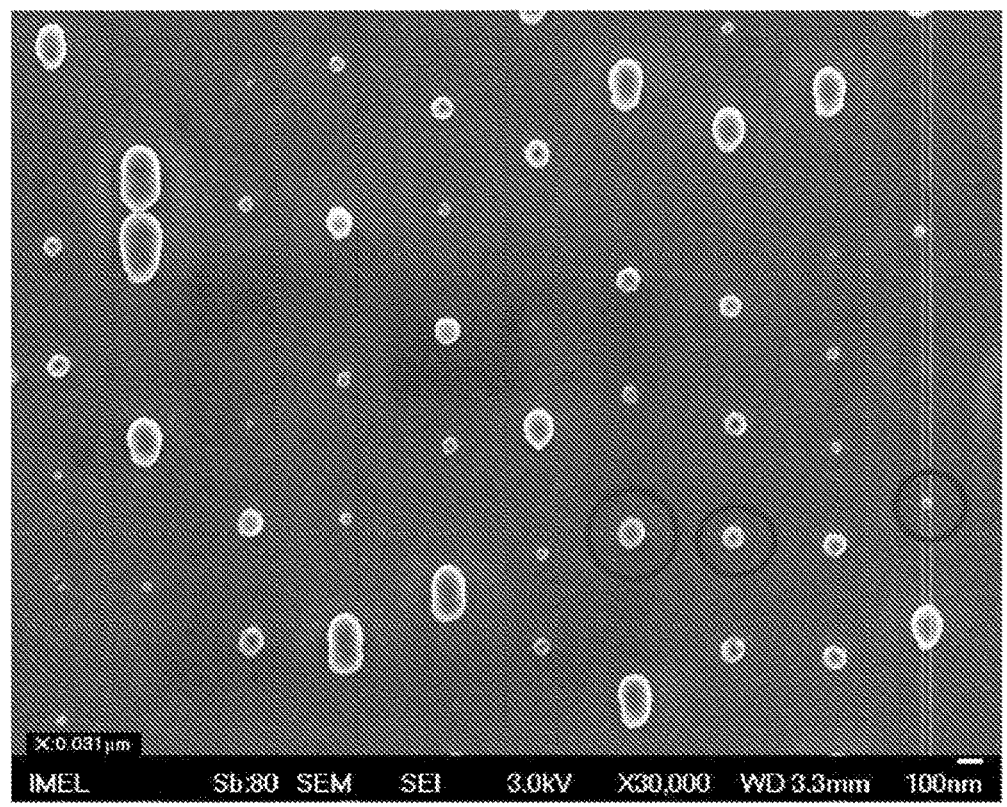
FIG. 13 shows a thin film of polymer 2 written by LBR.

Thin film coatings (polymer 2), without defects produced by perylene molecule aggregation, appear in FIG. 13. The power of the exposing laser varies from 40 to 80 mW, which attributes to several MW/cm2 light intensity. The length of the created structures is adjusted by the duration and the modulation of the laser pulses, taking values from 10 to several hundred nanoseconds. Structures shown have several dimensions in response to different power setting of the laser firing each pulse. The smallest created structure is in the sub 20 nm regime. Unfortunately, berm formation took place along to the nanopillars as it noticed with red circles.

Figure 14:
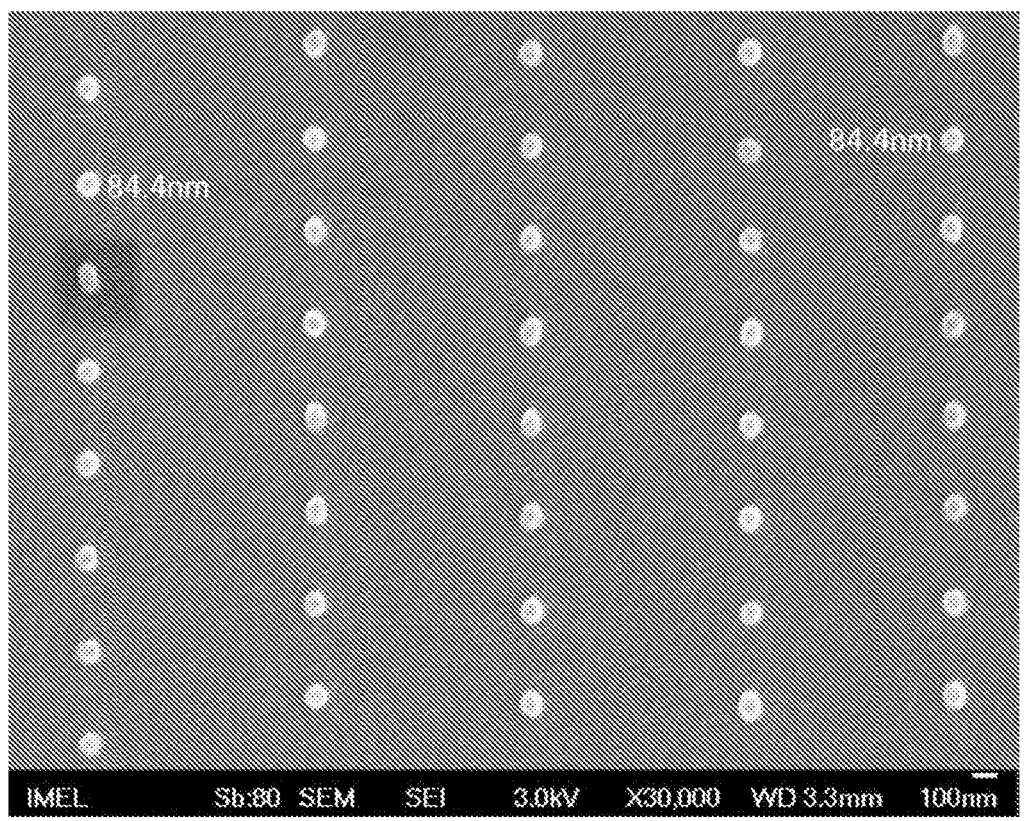
FIG. 14 shows a thin film of polymer 5 written by LBR.
Figure 15:
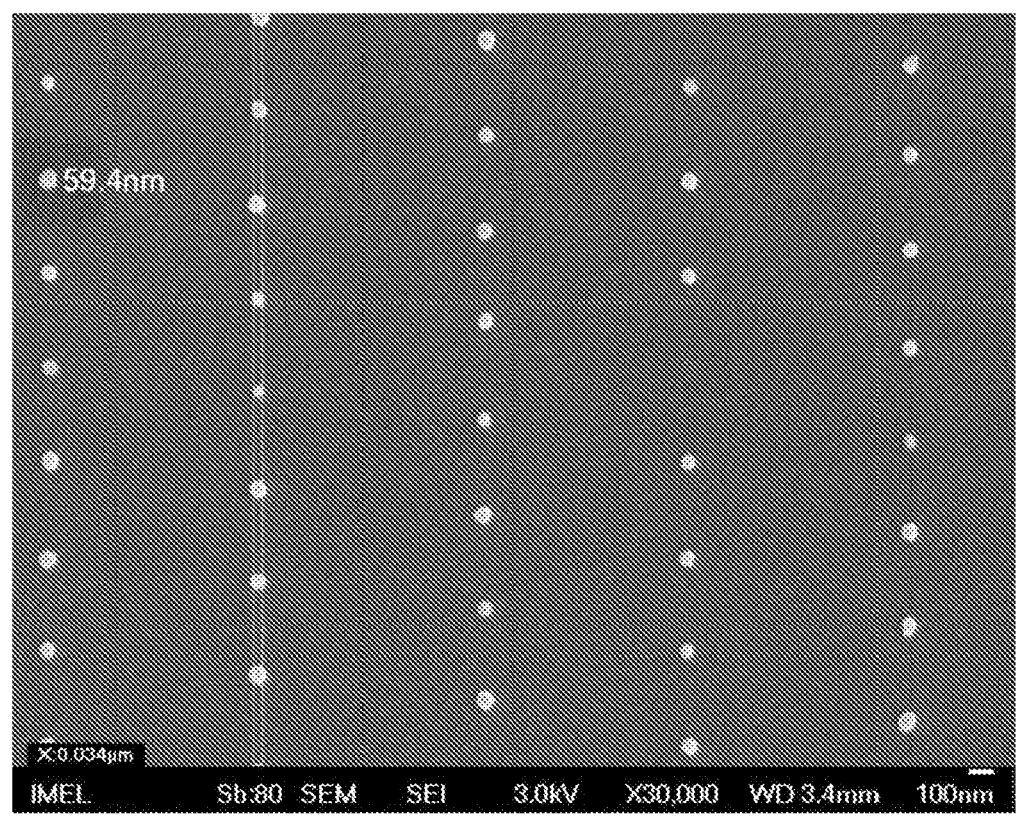
FIG. 15 also shows a thin film of polymer 5 written by LBR.
Figure 16:
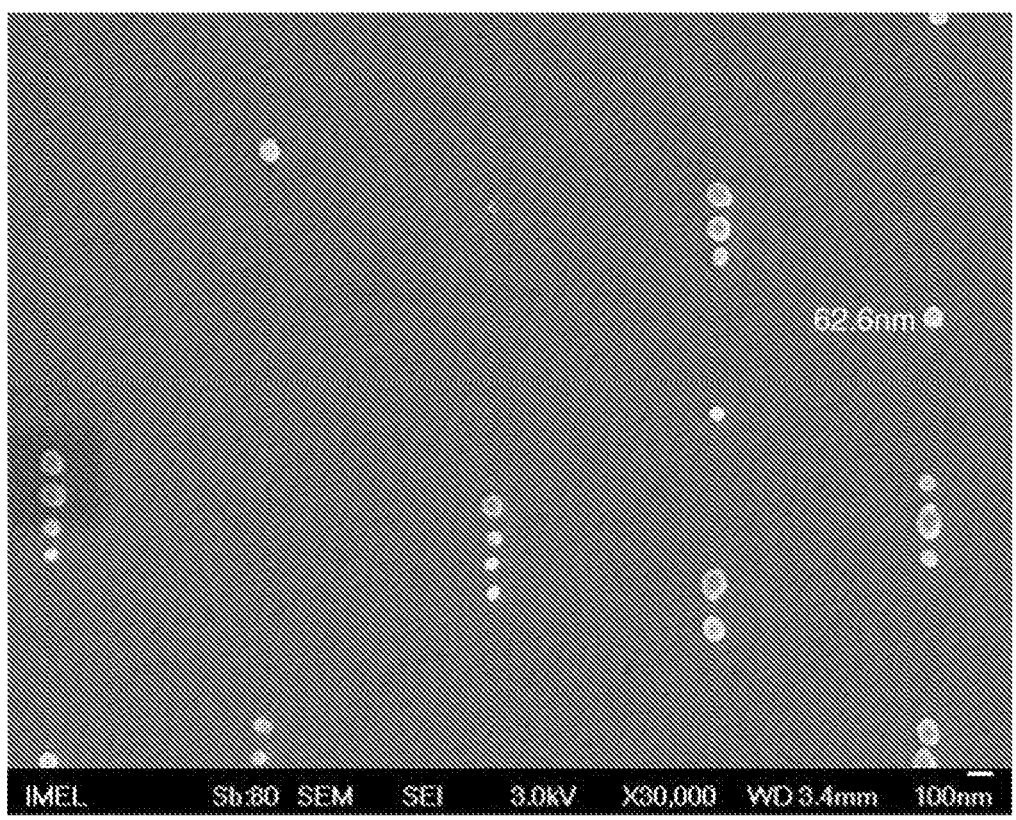
FIG. 16 shows another example of a thin film of polymer 5 written by LBR.

Polymer 3 and polymer 4 cannot be ablated in this range of laser power due to excessive crosslinking in the polymeric films. As it is shown in FIGS. 14, 15 and 16, well defined structures were possible to create by using Polymer 5, containing only 1% of crosslinkable groups. In this polymer structures, berm formation was not observed due to finely crosslinking the polymer.

The invention claimed is:

1. A method of photolithography, comprising the steps of:
   providing a translatable substrate having a composite thereon, the composite comprising:
      a first material having at least a first energy level, a second energy level, and at least one interceding energy level between the first and second energy levels, and
      a second material having at least a first energy level and a second energy level, wherein the second material is photodegraded when at least one electron is excited into the second energy level of the second material, wherein an energy gap between the first energy level and the at least one interceding energy level of the first material is less than the energy gap between the first and second energy level of the second material, and wherein the first material and second material are in communication with one another;
   determining an energy flux threshold of a pulse of photons required to be transmitted onto the composite in order to:
      excite at least one electron from the first energy level of the first material to the at least one interceding energy level;
      excite the at least one electron from the at least one interceding energy level to the second energy level of the first material; and
      transfer the at least one electron from the second energy level of the first material to the second energy level of the second material, to thereby form photodegraded areas in the second material;
   focusing a continuous wave laser with an objective lens including maintaining a focusing accuracy of approximately +/−0.5 percent using focused spot full width at half maximum (FWHM) diameter as a reference;
   exposing the composite to pulses of photons from the focused continuous wave laser directly modulated in pulse duration and pulse amplitude, wherein the continuous wave laser exhibits temporally a square-like profile, as a result of its direct modulation, and spatially a Gaussian laser beam profile, wherein photons at a center of the Gaussian laser beam profile deliver energy at or greater than the energy flux threshold, and less than the energy gap of the second material, and photons at a periphery of the Gaussian laser beam profile deliver less energy than the energy flux threshold; such that an electron of the first material contacted by the center of the Gaussian laser beam profile is excited from the first energy level of the first material to the second energy level of the first material, and wherein said electron transfers from the second energy level of the first material to the second energy level of the second material; and thereby forming photodegraded areas in the second material comprising holes with dimensions of less than approximately 100 nm;
   wherein the exposing step is performed while continuously translating the translatable substrate, so as to form a photolithographic pattern on the translatable substrate.

2. The method according to claim 1, wherein the second energy level of the first material is substantially equal to the second energy level of the second material.

3. The method according to claim 1, wherein the laser is a continuous diode laser.

4. The method according to claim 1, wherein the first material is a polyaromatic compound.

5. The method according to claim 1, wherein the first material is a dye.

6. The method according to claim 5, wherein the dye includes at least one of: a perylene, a coumarin, an aminoanthracene and an anthracene.

7. The method according to claim 1, wherein the second material is a polymer.

8. The method according to claim 1, wherein the first material is suspended in the second material.

9. The method according to claim 1, wherein the first material is bonded to the second material.

10. The method according to claim 1, wherein the second material is doped with the first material.

11. The method according claim 1, wherein the composite is a photoresist.

12. The method according to claim 1, wherein the pulse of the photons has an energy less than or equal to about 80 mW, even when assessed within a duration of a single pulse.

13. The method according to claim 1, wherein the substrate comprises at least one of: glass and silicon.

14. The method according to claim 1, wherein the focusing step is performed with an objective lens having a numerical aperture of 0.90 or greater.

15. The method according to claim 1, wherein the dimensions of the holes are less that approximately 50 nm.

16. The method according to claim 15, wherein the dimensions of the holes are less that approximately 20 nm.

* * * * *